(12) United States Patent
Zhao et al.

(10) Patent No.: US 8,319,530 B2
(45) Date of Patent: Nov. 27, 2012

(54) POWER EFFICIENT PUSH-PULL BUFFER CIRCUIT, SYSTEM, AND METHOD FOR HIGH FREQUENCY SIGNALS

(75) Inventors: Jianhua Zhao, Shanghai (CN); Sarah Gao, Shanghai (CN)

(73) Assignee: STMicroelectronics R&D (Shanghai) Co. Ltd, Shanghai (CN)

( * ) Notice: Subject to any disclaimer, the term of this patent is extended or adjusted under 35 U.S.C. 154(b) by 148 days.

(21) Appl. No.: 12/408,650

(22) Filed: Mar. 20, 2009

(65) Prior Publication Data
US 2009/0237125 A1 Sep. 24, 2009

(30) Foreign Application Priority Data

Mar. 21, 2008 (CN) .......................... 2008 1 0095198

(51) Int. Cl.
*H03B 1/00* (2006.01)
(52) U.S. Cl. .......................................... 327/112; 326/88
(58) Field of Classification Search .................. 327/112; 326/82, 88
See application file for complete search history.

(56) References Cited

U.S. PATENT DOCUMENTS

| | | | |
|---|---|---|---|
| 5,513,389 A | | 4/1996 | Reeser et al. |
| 5,534,810 A | * | 7/1996 | White ............................ 327/308 |
| 5,872,473 A | * | 2/1999 | Williams ........................ 327/108 |
| 6,114,898 A | * | 9/2000 | Okayasu ........................ 327/437 |
| 6,850,100 B2 | * | 2/2005 | Takeshita ....................... 327/112 |
| 7,030,670 B2 | * | 4/2006 | Lin ................................. 327/170 |
| 7,126,385 B2 | * | 10/2006 | Brekelmans et al. ........... 327/67 |
| 2005/0127957 A1 | * | 6/2005 | Ajit ................................ 327/112 |

* cited by examiner

*Primary Examiner* — Lincoln Donovan
*Assistant Examiner* — William Hernandez
(74) *Attorney, Agent, or Firm* — Graybeal Jackson LLP

(57) ABSTRACT

A buffer circuit includes a biasing circuit operable to generate first and second biasing signals. A capacitive network includes an input adapted to receive an input signal and the capacitive network is operable responsive to the input signal to generate first and second bootstrapped signals. A push-pull stage includes first and second control inputs and an output. The push-pull stage is coupled to the biasing circuit to receive the first and second biasing signals on the first and second control inputs, respectively, and is coupled to the capacitive network to receive the first and second bootstrapped signals on the first and second control inputs, respectively. The push-pull stage is operable to generate a buffered output signal on the output responsive to the first and second bootstrapped signals.

22 Claims, 7 Drawing Sheets

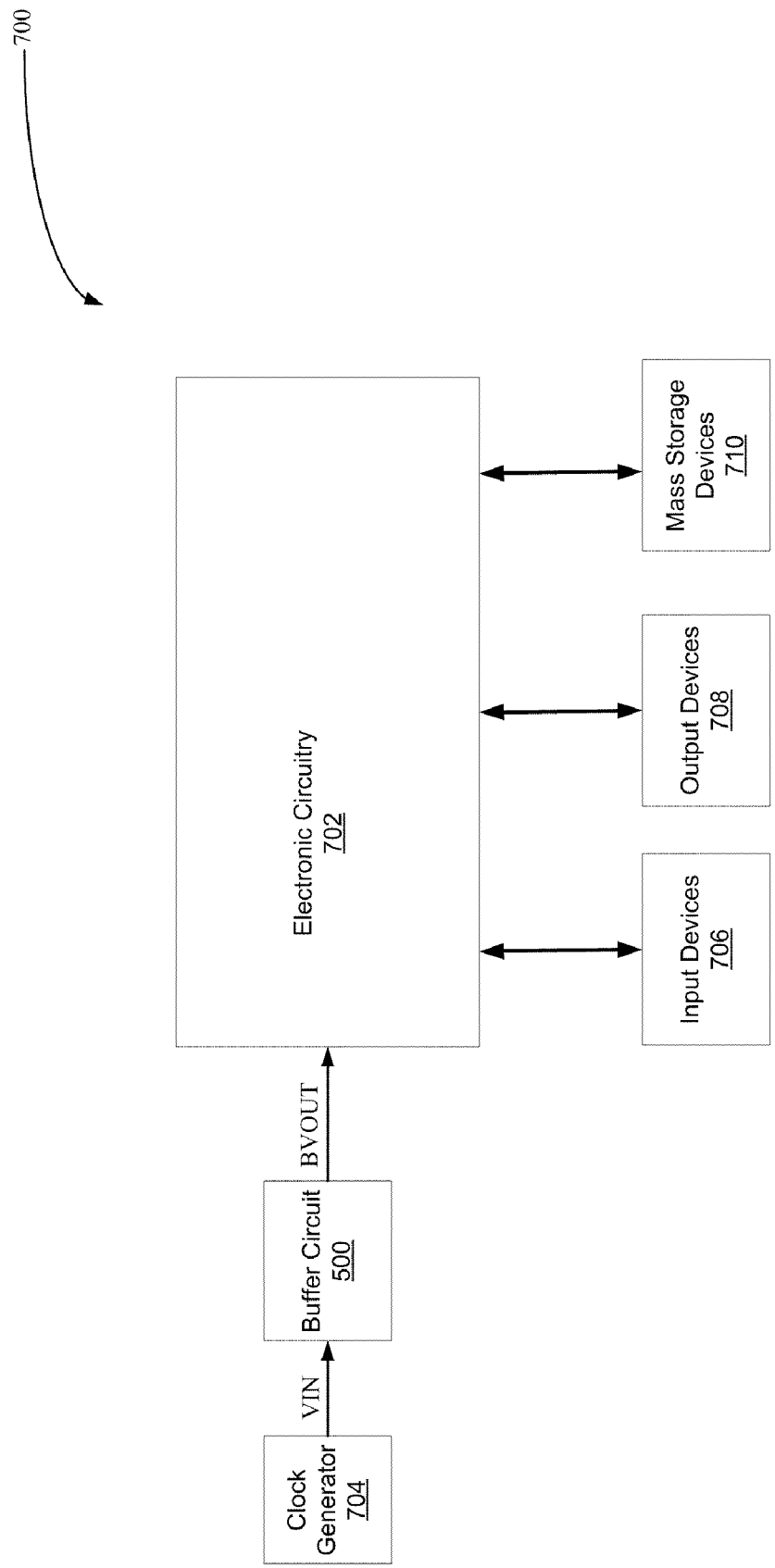

POWER EFFICIENT PUSH-PULL BUFFER CIRCUIT, SYSTEM, AND METHOD FOR HIGH FREQUENCY SIGNALS

PRIORITY CLAIM

The present application claims the benefit of Chinese Patent Application Serial No. 200810095198.0, filed Mar. 21, 2008, which application is incorporated herein by reference in its entirety.

TECHNICAL FIELD

Embodiments of the present disclosure relate generally to buffer circuits and more specifically to push-pull buffer circuits, systems, and methods for high frequency signals.

BACKGROUND

Many electronic systems utilize a high-frequency signal such as a clock signal that must be supplied to a large number of components within the system. In these situations, buffer circuits are typically needed to adequately drive the large number of components receiving the clock signal and to isolate a circuit generating the high frequency clock signal, such as a crystal oscillator, from the large number of components. This isolation is needed so that the circuit generating the high frequency clock signal is not unduly loaded by these components, which can result in undesirable variations in the high-frequency clock signal such as variations in frequency, amplitude and phase of the clock signal.

FIG. 1 illustrates a conventional architecture for buffering a clock signal that is utilized in cellular telephones. In this architecture, a crystal oscillator 100 generates a high-frequency clock signal CLK that is supplied to a plurality of parallel-connected buffers 102. Each buffer 102 generates a corresponding buffered clock signal BCLK in response to the CLK signal from the oscillator 100 and supplies this buffered clock signal to corresponding RF circuitry 104, analog baseband circuitry 106, and digital baseband circuitry 108 within the cellular telephone. The buffers 102 are utilized and are needed because if the crystal oscillator 100 were directly connected to the RF circuitry 104, analog baseband circuitry 106, and digital baseband circuitry 108 the resulting load on the oscillator could cause the frequency, amplitude, and phase of the CLK signal to undesirably vary. The buffers 102, however, can consume an undesirable amount of power and can become more complex circuits as supply voltages (not shown) provided to these buffers and other components in the cellular telephone are reduced to lower the overall power consumption of the telephone.

Other known architectures have been utilized for buffering high-frequency clock or other signals, such as a plurality of series-connected inverters as shown in FIG. 2. In this approach, a high-frequency clock signal CLK propagates through a plurality of series-connected inverters to generate a buffered clock signal BCLK, with two such inverters 202 and 204 being shown in the example of FIG. 2. Note that went inverters are utilized the buffered clock signal BCLK is a square wave signal even when the applied clock signal CLK is a sinusoidal signal. This square wave BCLK signal includes high-frequency harmonics which can cause unwanted interference in RF circuitry and other circuitry receiving the buffered clock signal.

FIG. 3 is a simplified schematic illustrating another conventional architecture for buffering a high-frequency clock signal CLK through a high bandwidth unity gain amplifier 300 to generate a buffered clock signal BCLK. In this situation, the amplifier 300 BCLK signal is also a sinusoidal signal and thus the same problems with unwanted harmonics do not exist when compared to the approach of FIG. 2. Since the CLK signal is a high frequency signal, however, the amplifier 300 must accordingly be a high bandwidth amplifier that may consume a relatively large amount of power.

FIG. 4 is a simplified schematic of another conventional approach for buffering a clock signal through a source-follower amplifier 400. The source-follower amplifier 400 includes an NMOS transistor 402 connected in series with the current source 404 between a supply voltage VDD and ground. In response to a high-frequency clock signal CLK applied to the gate of the NMOS transistor 402 the transistor develops a buffered clock signal BCLK on its source. With the source follower 400, the voltage swing of the BCLK signal is limited by the gate-to-source voltage Vgs of the NMOS transistor 402 and if the lowest level of the CLK signal is less than the gate-to-source voltage the buffer clock signal will be clipped. As the magnitude of the supply voltage Vdd decreases, the gate-to-source voltage Vgs of the NMOS transistor 402 becomes a significant hindrance to proper operation of the source follower 400.

There is a need for improved circuits, systems, and methods for buffering high-frequency signals such as high-frequency clock signals.

SUMMARY

According to one embodiment of the present disclosure, a buffer circuit includes a biasing circuit operable to generate first and second biasing signals. A capacitive network includes an input adapted to receive an input signal and the capacitive network is operable responsive to the input signal to generate first and second bootstrapped signals. A push-pull stage includes first and second control inputs and an output. The push-pull stage is coupled to the biasing circuit to receive the first and second biasing signals on the first and second control inputs, respectively, and is coupled to the capacitive network to receive the first and second bootstrapped signals on the first and second control inputs, respectively. The push-pull stage is operable to generate a buffered output signal on the output responsive to the first and second bootstrapped signals. The input signal may be a clock signal and the buffer circuit may be contained in an electronic system.

According to another embodiment of the present disclosure, a method of utilizes a push-pull stage to generate a buffered output signal. The push-pull stage includes first and second control inputs and an output. The method includes applying first and second biasing signals to the first and second control inputs, generating an input signal, generating first and second bootstrapped signals responsive to the input signal, and applying the first and second bootstrapped signal on the first and second control inputs to cause the push-pull stage to generate the buffered output signal on the output responsive to the first and second bootstrapped signals.

BRIEF DESCRIPTION OF THE DRAWINGS

FIG. 7 is a functional block diagram of an electronic system including one or more buffer circuits of FIG. 5 according to another embodiment of the present disclosure.

DETAILED DESCRIPTION

Figure 5:
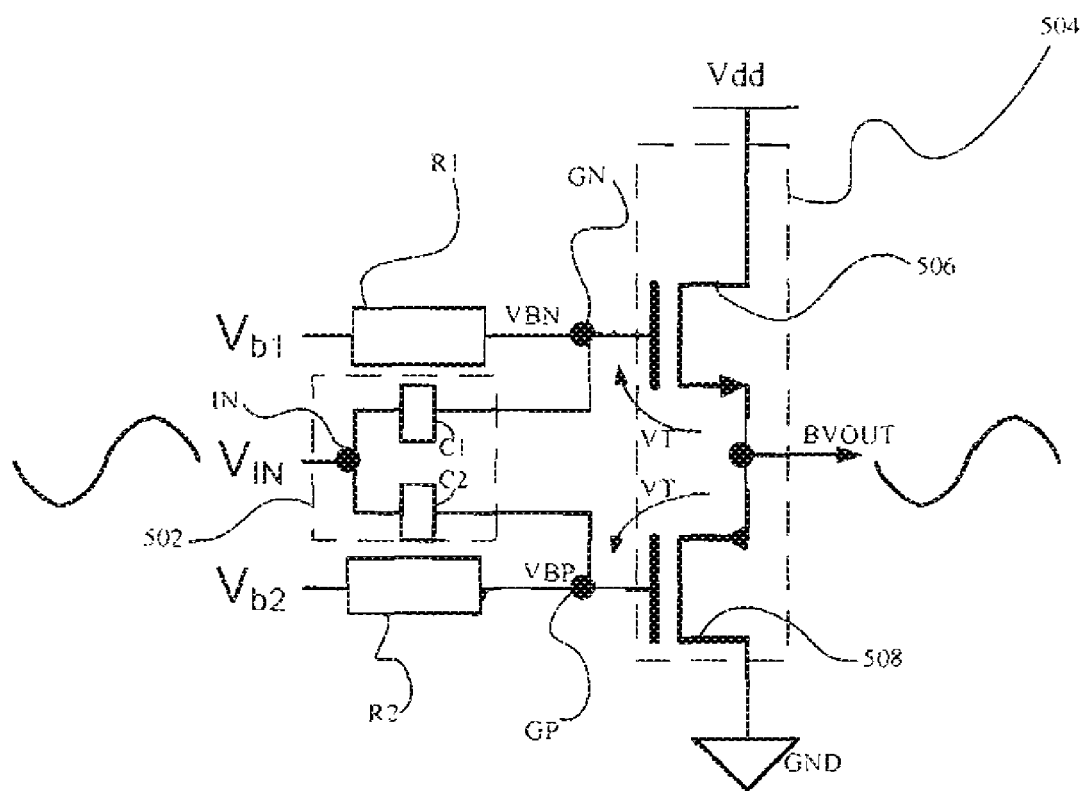
FIG. 5 is a schematic of a buffer circuit including a push-pull stage according to one embodiment of the present disclosure.

FIG. 5 is a schematic of a buffer circuit 500 including a capacitive network 502 that receives an input signal VIN and develops bootstrapped control signals VGN, VGP responsive to the input signal to drive a push-pull stage 504 according to one embodiment of the present disclosure. In operation, responsive to the input signal VIN the capacitive network 502 develops the bootstrapped control signals VBN and VBP having magnitudes that can be greater than a supply voltage Vdd and less than a reference voltage GND, respectively, to thereby drive the push-pull stage 504 to generate a buffer output signal BVOUT having a full-range voltage swing from the supply voltage to the reference voltage, as will be explained in more detail below. The buffer circuit 500 consumes a relatively low amount of power while allowing the buffered output signal BVOUT to have a full-range voltage swing between the supply voltage Vdd and reference voltage GND even for low supply voltages.

In the present description, certain details are set forth in conjunction with the described embodiments of the present disclosure to provide a sufficient understanding of the disclosure. One skilled in the art will appreciate, however, that the disclosure may be practiced without these particular details. Furthermore, one skilled in the art will appreciate that the example embodiments described below do not limit the scope of the present disclosure, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. Finally, the operation of well known components and/or processes has not been shown or described in detail below to avoid unnecessarily obscuring the present disclosure.

The push-pull stage 504 includes an NMOS transistor 506 and PMOS transistor 508 connected in series between the supply voltage VDD and the reference voltage GND in the example of FIG. 5. The gate of the NMOS transistor 506 is designated as a node GN in the figure and defines a first control input of the push-pull stage 504. Similarly, the gate of the PMOS transistor 508 is designated as a node GP and defines a second control input of the push-pull stage 504. The interconnected sources of the NMOS and PMOS transistors 506 and 508 define an output of the buffer circuit 500 on which the buffered output signal BVOUT is developed. As illustrated in FIG. 5, the NMOS transistor 506 has an associated gate-to-source threshold voltage VT and the PMOS transistor 508 an associated gate-to source voltage threshold voltage VT. These voltages will be utilized below in describing the overall operation of the buffer circuit 500.

In the example embodiments of FIG. 5, a capacitive network 502 includes a first capacitor C1 coupled between an input node IN that receives the input signal VIN and the first control input node GN coupled to the gate of the NMOS transistor 506. A second capacitor C2 is similarly coupled between the input node IN and the second control input node GP coupled to the gate of the PMOS transistor 508. As will be described below in more detail, the first and second capacitors C1 and C2 have values such that at the operating frequency of the buffer circuit, which is defined by the frequency of the input signal VIN, the capacitor network 502 generates the bootstrapped signals VBN and VBP on the first and second control input nodes GN and GP.

The buffer circuit 500 further includes a biasing circuit which in the example of FIG. 5 is formed by a first resistor R1 through which a first bias voltage Vb1 is supplied to the first control input node GN and a second resistor R2 through which a second bias voltage Vb2 is supplied to the second control input node GP. The values of the resistors R1 and R2 and the bias voltages Vb1 and Vb2 are selected to bias the transistors 506 and 508 in the push-pull stage 504 for either class B or a class AB mode of operation. As will be understood by those skilled in the art, the terms "class B" and "class AB" are terms utilized to describe the operation of switching elements in power amplifiers and thus will not be explained in detail herein. Briefly, the class B mode of operation is defined by each of the transistors 506 and 508 being turned on or active for half of the cycle of the input signal VIN. In the class AB mode of operation, each of the transistors 506 and 508 is biased to be slightly turned ON at all times and to thereby reduce so-called "crossover distortion" that occurs at a crossing point of the input signal VIN when the input signal passes through a defined threshold value and changes from having a value greater than the threshold value to a value less than the threshold value, or vice versa.

The overall operation of the buffer circuit 500 of FIG. 5 will now be described in more detail with reference to FIGS. 5 and 6, with FIG. 6 being a signal diagram illustrating the voltages on several nodes of the buffer circuit during operation. In operation, the biasing circuit including resistors R1 and R2 provide the biasing voltages Vb1 and Vb2 to the first and second control input nodes GN and GP to bias the NMOS transistor 506 and PMOS transistor 508 in the push-pull stage 504 for class AB operation. The values of the resistors R1 and R2 and biasing voltages Vb1 and Vb2 are chosen accordingly.

Under these biasing conditions, the transistors 506 and 508 are only slightly turned ON so that the buffer circuit 500 consumes only a relatively small static or DC biasing current. Also at this point the buffered output voltage BVOUT has a value of approximately one half the supply voltage Vdd, namely Vdd/2. Accordingly, at this point the first control input node GN has a voltage of slightly less than the threshold voltage VT of the NMOS transistor 506 plus Vdd/2 and the second control input node GP has a voltage of slightly greater than Vdd/2 minus the threshold voltage VT of the PMOS transistor 508. In the example of FIG. 6, this results in the bias voltages present on the first and second control input nodes GN and GP being relatively close to the supply voltage Vdd and ground GND as illustrated. This is true because the supply voltage Vdd is assumed to have a relatively low value, such as 1.5 volts, in the example of FIG. 6. When the supply voltage Vdd has the value of 1.5 volts and the threshold voltages VT of the transistors 506 and 508 are assumed to be approximately 0.7 volts, with the buffered output voltage BVOUT at approximately 0.75 volts (Vdd/2), the first control input node GN will be at approximately 1.45 volts (0.75+0.7) and will thus have a value near the supply voltage Vdd as illustrated in FIG. 6. Similarly, the second control input node GP will be at approximately 0.05 volts (0.75-0.7) and will bus have a value near the reference voltage GND, also is illustrated in FIG. 6.

In operation, an input signal VIN, which may be a clock signal or other high-frequency signal such as an RF modulated carrier signal, is applied to the capacitive network 502. As shown in FIG. 6, the input signal VIN has an amplitude that varies between ground and the supply voltage Vdd and has a DC offset of approximately Vdd/2. In response to the input signal VIN, the capacitive network 502 generates the bootstrapped control signals VBN and VBP on the first and second control input nodes GN and GP coupled to the gates of the NMOS transistor 506 and a PMOS transistor 508, respectively. As illustrated in FIG. 6, the peak-to-peak voltage swings of the bootstrapped control signals VBN, VBP have approximately the same values as the peak-to peak voltage swing of the input signal VIN (i.e., Vdd) but with a different offset voltage.

These offset voltages for the bootstrapped control signals VBN, VBP are caused by the capacitors C1 and C2 in the capacitive network 502 which function to "bootstrap" the input signal VIN and thereby develop the bootstrap control signals VBN, VBP. From the above description of the biasing conditions of the buffer circuit 500, each capacitor C1 and C2 has a voltage with a magnitude of approximately Vdd/2 across that capacitor under the biasing conditions (VIN equals a static Vdd/2). As a result, when input signal VIN begins its first half cycle as shown in FIG. 6 and thus begins going lower than the offset Vdd/2, the bootstrapped control signal VBP similarly begins going lower but is "bootstrapped" or offset by the initial voltage across the capacitor C2, which is just less than Vdd/2 as previously described. As a result, the input signal VIN is bootstrapped by the capacitor C2 to generate the bootstrapped control signal VBP that tracks the input signal but is offset from the input signal as illustrated in FIG. 6. The bootstrapped control signal VBN is developed in similar way on the node GN as illustrated and thus will not be described in more detail. Note that the values of the capacitors C1 and C2 are appropriately selected to provide this operation at the frequency of the input signal VIN.

Figure 6:
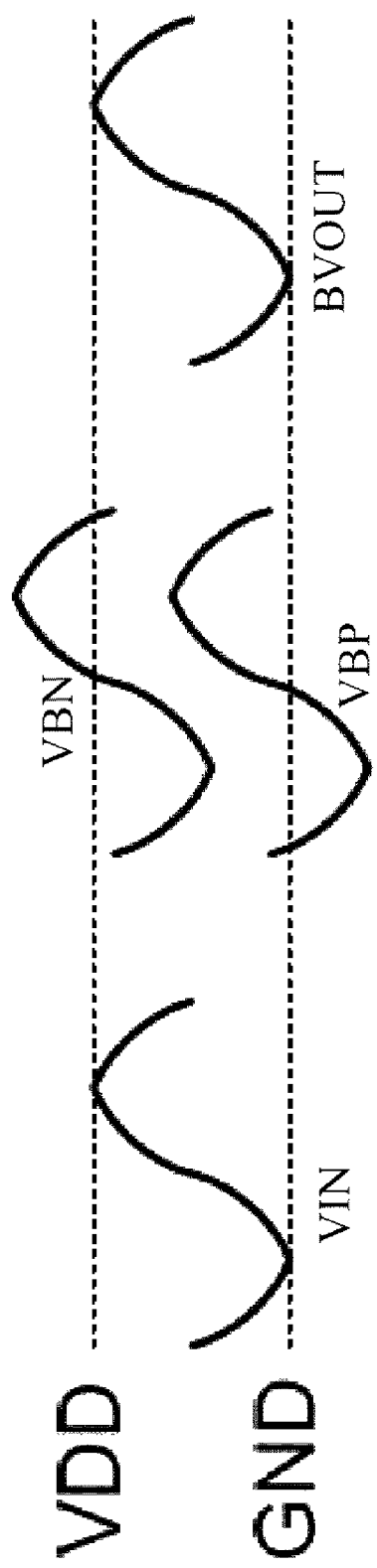
FIG. 6 is a signal diagram illustrating the voltages on several nodes of the buffer circuit of FIG. 5 during operation of the buffer circuit.

As seen in FIG. 6, this operation of the capacitive network 502 generates the bootstrap control signal VBN having a value greater than the supply voltage VDD during a portion of the cycle of the input signal VIN. Similarly, the capacitive network 202 generates the bootstrap control signal VBP having a value that is less than the value of the reference voltage GND during a portion of the cycle of input signal VIN. In this way, the NMOS transistor 506 and PMOS transistor 508 in the push-pull stage 504 function in a push-pull manner responsive to the bootstrap to control signals VBN and VBP to generate the buffered output signal BVOUT having an offset of approximately Vdd/2 and a very similar shape to the input signal VIN. As the input signal VIN initially goes low or less than the offset Vdd/2 during the first half cycle of the input signal, the bootstrapped control signal VBP applied to the gate of that PMOS transistor 508 causes that transistor to amplify this first half cycle portion of the input signal and generate the corresponding first half cycle portion of the buffered output signal BVOUT. During this portion of the operation of the push-pull stage 504, the NMOS transistor 506 is substantially OFF as will be understood during conventional push-pull operation. As the input signal VIN goes high or greater than the offset Vdd/2 during the second half cycle of the input signal, the bootstrapped control signal VBP substantially turns OFF the PMOS transistor 508 and the bootstrapped control signal VBN turns ON the NMOS transistor 506 to amplify this second half cycle portion of the input signal and generate the corresponding second half cycle portion of the buffered output signal BVOUT.

The bootstrapped control signals VBN and VBP having values greater than and less than the supply voltage Vdd and reference voltage GND during portions of the cycle of the input signal VIN enable the push-pull stage 504 to generate the buffered output signal BVOUT without any clipping and having a very similar shape to the input signal VIN. For example, when input signal VIN has a value of approximately Vdd during the second half cycle of the input signal the bootstrapped control signal VBN has a voltage slightly greater than Vdd+VT so that the NMOS transistor 506 can't remain conducting and drive its source and thus the buffered output signal BVOUT to approximately the supply voltage Vdd as required. The PMOS transistor 508 functions in a similar way in response to the bootstrapped control signal being less than the reference voltage GND during the first half cycle of the input signal VIN.

The specific circuitry illustrated for the push-pull stage 504, capacitive network 502, and biasing circuit in the embodiment of the buffer circuit 500 in FIG. 5 may vary in other embodiments of the present disclosure, as will be appreciated by those skilled in the art. For example, other configurations of capacitive elements may be utilized in forming the capacitive network 502. In one such embodiment a first capacitor is coupled between the input node IN and the first control input node GN while a second capacitor is coupled from the first control input node GN to the second control input node GP. Similarly, the biasing circuit formed by resistors R1 and R2 in the embodiment of FIG. 5 may be formed from different configurations of resistive elements, and may also be formed from other suitable impedance elements such as inductors. In another embodiment, the resistors R1 and R2 are replaced by corresponding inductive elements L1 and L2. Also note that the push-pull stage 504 need not be formed from MOS transistors, but instead can be formed from other types of transistors such as bipolar transistors and gallium arsenide transistors. Finally, as already mentioned above the input signal VIN need not be a clock signal but instead may be some other type of high-frequency signal such as a high frequency digital signal or a high-frequency modulated carrier signal.

Figure 1:
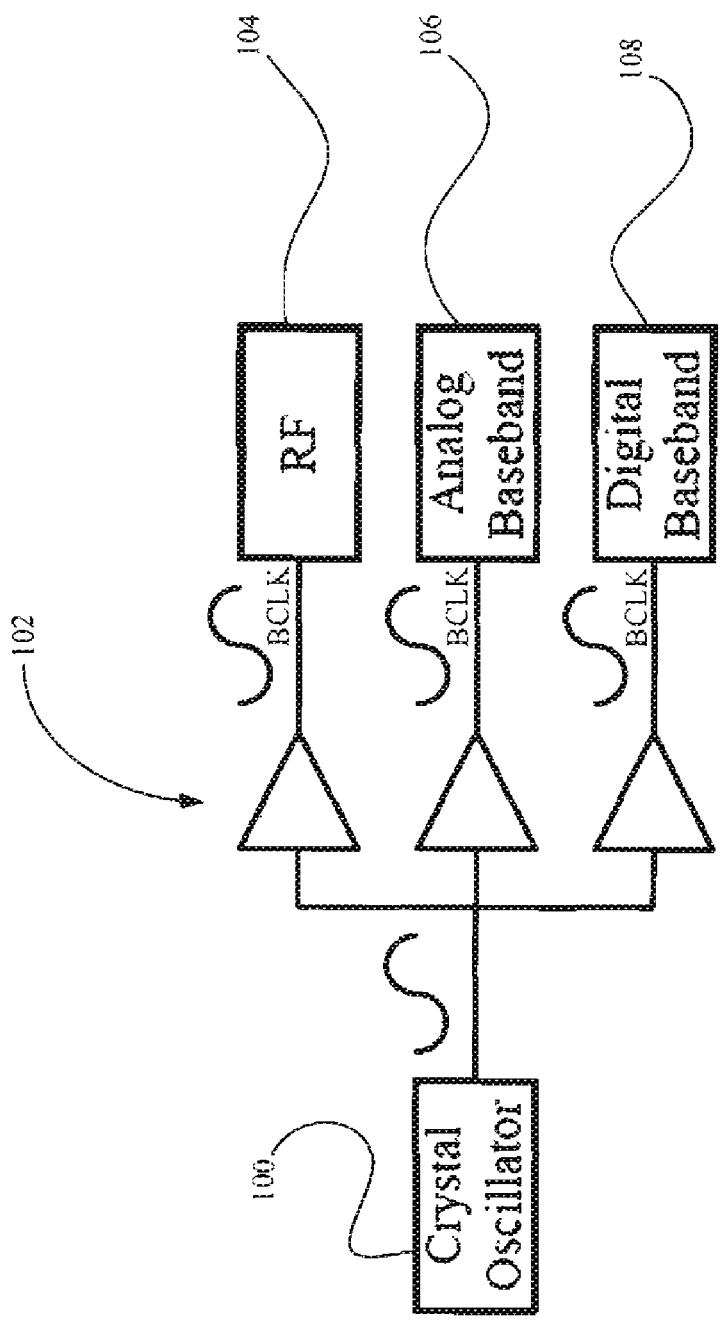
FIG. 1 is a simplified schematic of a first conventional architecture for buffering a clock signal through a plurality of clock buffers for distributing the clock signal.
Figure 2:
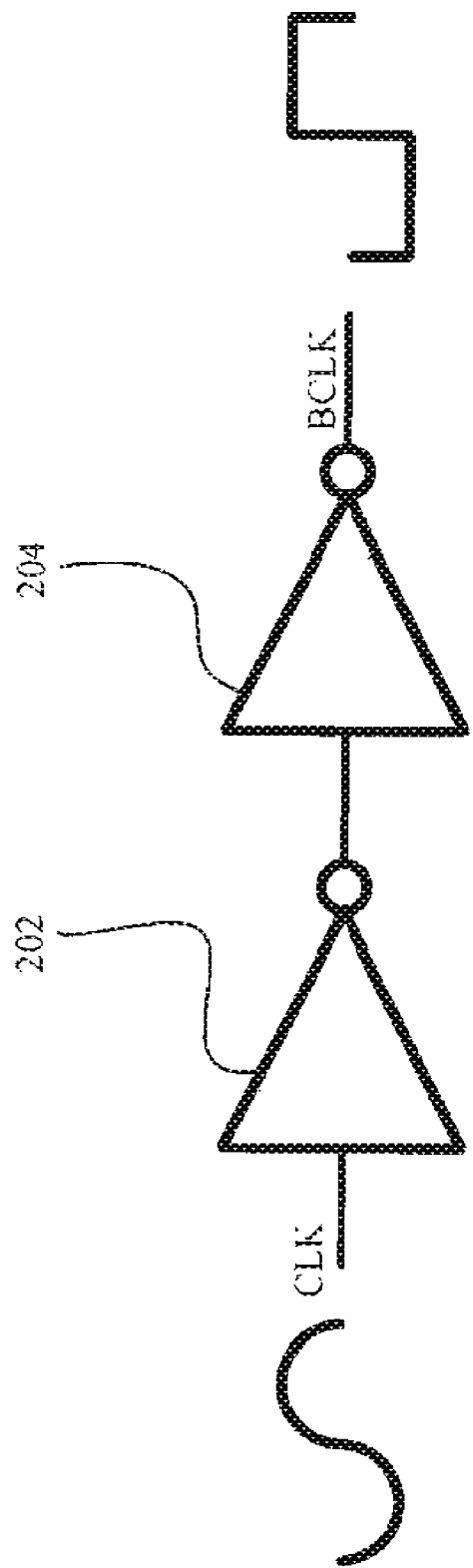
FIG. 2 is a simplified schematic of a second conventional architecture for buffering a clock signal through a plurality of series-connected inverters.
Figure 3:
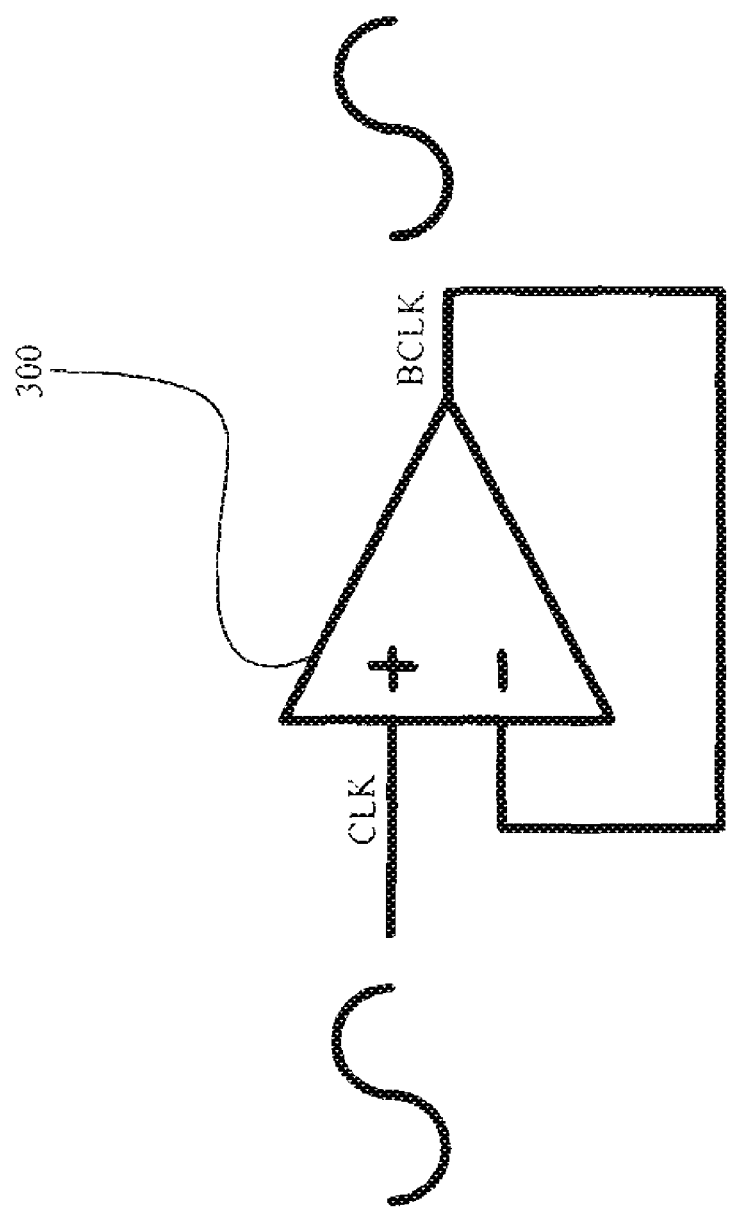
FIG. 3 is a simplified schematic of a third conventional architecture for buffering a clock signal through a high bandwidth unity gain amplifier.
Figure 4:
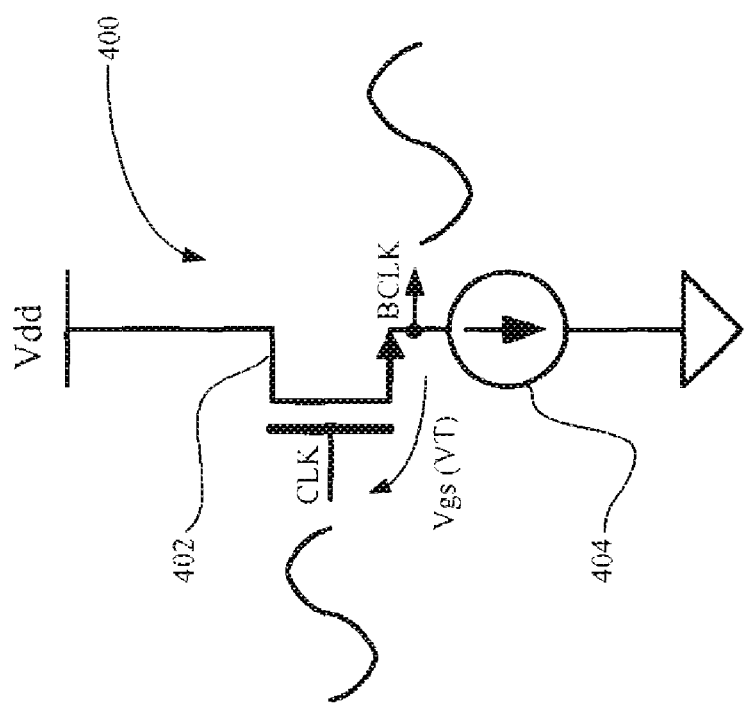
FIG. 4 is a simplified schematic of a fourth conventional architecture for buffering a clock signal through a source-follower amplifier.

FIG. 7 is a block diagram of an electronic system 700 including electronic circuitry 702 that receives the buffered output signal BVOUT from the buffer circuit 500 of FIG. 5 according to one embodiment of the present disclosure, including the memory device 800 of FIG. 8. An input signal generation circuit 704, such as a crystal oscillator where the input signal VIN is a clock signal, provides the input signal to the buffer circuit 500. The electronic circuitry 702 may be a variety of different types of electronic circuitry, such as communication circuitry similar to that discussed with reference to FIG. 1 or other communications circuitry, or other types of circuitry like computer circuitry. The system 700 can also include one or more input devices 706 such as a keypad, biometric sensor, or keyboard or mouse, one or more output devices 708 such as a display or other type of video terminal, and one or more data storage devices 710 such as a FLASH memory, hard disk, or other type of memory or mass storage device.

Even though various embodiments and advantages of the present disclosure have been set forth in the foregoing description, the above disclosure is illustrative only, and changes may be made in detail and yet remain within the broad principles of the present disclosure. Moreover, the functions performed by the components 502, 504, and the biasing circuitry can be combined to be performed by fewer elements, separated and performed by more elements, or combined into different functional blocks in alternative embodiments of the present disclosure, as will be appreciated by those skilled in the art. Therefore, the present disclosure is to be limited only by the appended claims.

What is claimed is:

1. A buffer circuit, comprising:
    a biasing circuit operable to generate first and second biasing signals;
    a capacitive network including an input adapted to receive an input signal and the capacitive network operable responsive to the input signal to generate first and second bootstrapped signals; and
    a push-pull stage including first and second control inputs and an output, the push-pull stage being coupled to the biasing circuit to receive the first and second biasing signals on the first and second control inputs, respectively, and coupled to the capacitive network to receive the first and second bootstrapped signals on the first and second control inputs, respectively, the push-pull stage operable to generate a buffered output signal on the output responsive to the first and second bootstrapped signals;
    wherein the biasing circuit comprises elements sized to bias the push-pull stage between a turn-on threshold and a fully on state.

2. The buffer circuit of claim 1 wherein biasing circuit is operable to apply the first and second biasing voltages to bias the push-pull stage for class B operation.

3. The buffer circuit of claim 1 wherein biasing circuit is operable to apply the first and second biasing voltages to bias the push-pull stage for class AB operation.

4. The buffer circuit of claim 1 wherein the input signal is a sinusoidal clock signal.

5. The buffer circuit of claim 1 wherein the capacitive network comprises:
    a first capacitive element coupled between the input node and the first control input of the push-pull stage; and
    a second impedance element coupled between the input node and the second control input of the push-pull stage.

6. The buffer circuit of claim 1 wherein the biasing circuit comprises:
    a first impedance element having a first node adapted to receive a first bias voltage and having a second node coupled to the first control input of the push-pull stage, the first bias voltage being applied through the first impedance element to develop the first biasing voltage; and
    a second impedance element having a first node adapted to receive a second bias voltage and having a second node coupled to the second control input of the push-pull stage, the second bias voltage being applied through the second impedance element to develop the second biasing voltage.

7. The buffer circuit of claim 6 wherein each of the impedance elements comprises an inductive element.

8. The buffer circuit of claim 6 wherein each of the impedance elements comprises a resistive element.

9. The buffer circuit of claim 1 wherein the push-pull stage comprises:
    a first type transistor having a control node coupled to the first control input, a first signal node adapted to receive a supply voltage, and a second signal node coupled to the output; and
    a second type transistor having a control node coupled to the second control input, a first signal node adapted to receive a reference voltage, and a second signal node coupled to the output.

10. The buffer circuit of claim 9,
    wherein the supply voltage is a positive supply voltage and the reference voltage is a ground voltage;
    wherein the first bootstrapped signal has a magnitude that is greater than a magnitude of the supply voltage for portions of the input signal; and
    wherein the second bootstrapped signal has a negative magnitude that is less than a magnitude of the reference voltage for portions of the input signal.

11. The buffer circuit of claim 9 wherein the first type transistor comprises an NMOS transistor and the second type transistor comprises a PMOS transistor.

12. The buffer circuit of claim 9 wherein the first type transistor comprises an NPN transistor and the second type transistor comprises a PNP transistor.

13. An electronic system, comprising:
    a signal generation circuit operable to generate an input signal;
    a buffer circuit coupled to the signal generation circuit to receive the input signal, the buffer circuit comprising:
        a biasing circuit operable to generate first and second biasing signals;
        a capacitive network including an input adapted to receive the input signal and the capacitive network operable responsive to the input signal to generate first and second bootstrapped signals; and
        a push-pull stage including first and second control inputs and an output, the push-pull stage being coupled to the biasing circuit to receive the first and second biasing signals on the first and second control inputs, respectively, and coupled to the capacitive network to receive the first and second bootstrapped signals on the first and second control inputs, respectively, the push-pull stage operable to generate a buffered output signal on the output responsive to the first and second bootstrapped signals;
        wherein the biasing circuit comprises elements sized to bias the push-pull stage between a turn-on threshold and a fully on state; and
    electronic circuitry coupled to the output of the push-pull stage of the buffer circuit to receive the buffered output signal.

14. The electronic system of claim 13 wherein the electronic circuitry comprises wireless communications circuitry.

15. The electronic system of claim 13 wherein the electronic circuitry comprises computer circuitry.

16. The electronic system of claim 15 further comprising input devices, output devices, and storage devices coupled to the computer circuitry.

17. The electronic system of claim 13 wherein the signal generation circuitry comprises clock generation circuitry and the input signal is a clock signal.

18. A method of utilizing a push-pull stage to generate a buffered output signal, the push-pull stage including first and second control inputs and an output, and method comprising:
    applying first and second biasing signals to the first and second control inputs, the biasing signals having a magnitude suited to set the push-pull stage between slightly on and fully on;
    generating an input signal;
    generating first and second bootstrapped signals responsive to the input signal; and applying the first and second bootstrapped signal on the first and second control inputs to cause the push-pull stage to generate the buffered output signal on the output responsive to the first and second bootstrapped signals.

19. The method of claim 18 wherein the input signal comprises a digital clock signal.

20. The method of claim 18 wherein the input signal comprises a modulated high frequency carrier signal.

21. A buffer circuit, comprising:
a biasing circuit operable to generate first and second biasing signals;
a capacitive network including an input adapted to receive an input signal and the capacitive network operable responsive to the input signal to generate first and second bootstrapped signals; and
a push-pull stage including first and second control inputs and an output, the push-pull stage being coupled to the biasing circuit to receive the first and second biasing signals on the first and second control inputs, respectively, and coupled to the capacitive network to receive the first and second bootstrapped signals on the first and second control inputs, respectively, the push-pull stage operable to generate a buffered output signal on the output responsive to the first and second bootstrapped signals;
wherein the biasing circuit comprises elements sized to bias the push-pull stage between a turn-off threshold and a fully on state.

22. A buffer circuit, comprising:
a biasing circuit operable to generate first and second biasing signals;
a capacitive network including an input adapted to receive an input signal and the capacitive network operable responsive to the input signal to generate first and second bootstrapped signals; and
a push-pull stage including first and second control inputs and an output, the push-pull stage being coupled to the biasing circuit to receive the first and second biasing signals on the first and second control inputs, respectively, and coupled to the capacitive network to receive the first and second bootstrapped signals on the first and second control inputs, respectively, the push-pull stage operable to generate a buffered output signal on the output responsive to the first and second bootstrapped signals;
wherein the biasing circuit comprises elements sized to bias the push-pull stage between a class B mode of operation and a class AB mode of operation.

* * * * *